United States Patent
Cho et al.

(10) Patent No.: US 7,353,326 B2
(45) Date of Patent: Apr. 1, 2008

(54) FLASH MEMORY DEVICE SUPPORTING CACHE READ OPERATION

(75) Inventors: Hyun-Duk Cho, Yongin-si (KR); Young-Joon Choi, Seongnam-si (KR); Tae-Gyun Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 258 days.

(21) Appl. No.: 11/311,589

(22) Filed: Dec. 16, 2005

(65) Prior Publication Data

US 2006/0224820 A1 Oct. 5, 2006

(30) Foreign Application Priority Data

Apr. 1, 2005 (KR) ...................... 10-2005-0027659

(51) Int. Cl.
*G06F 12/00* (2006.01)
(52) U.S. Cl. ..................... 711/103; 711/3; 711/118; 711/154; 365/185.12; 365/233
(58) Field of Classification Search ............. 711/103.3, 711/118, 154; 365/185.12, 233
See application file for complete search history.

(56) References Cited

U.S. PATENT DOCUMENTS

| | | | |
|---|---|---|---|
| 6,260,102 B1 | 7/2001 | Robinson | |
| 6,717,857 B2 | 4/2004 | Byeon et al. | |
| 7,038,946 B2* | 5/2006 | Hosono et al. | 365/185.17 |
| 7,236,424 B2* | 6/2007 | Tokiwa | 365/233 |
| 7,269,064 B2* | 9/2007 | Kim | 365/185.12 |
| 2004/0003168 A1 | 1/2004 | Kim et al. | |
| 2005/0226046 A1* | 10/2005 | Lee et al. | 365/185.12 |
| 2005/0257120 A1* | 11/2005 | Gorobets et al. | 714/763 |

FOREIGN PATENT DOCUMENTS

| | | |
|---|---|---|
| JP | 2003-141882 | 5/2003 |
| JP | 2004-005699 | 1/2004 |
| KR | 2000-0069729 | 11/2000 |
| KR | 10-2003-0033679 | 5/2003 |
| KR | 10-2003-0092854 | 12/2003 |

* cited by examiner

*Primary Examiner*—Stephen C. Elmore
(74) *Attorney, Agent, or Firm*—Volentine & Whitt, PLLC

(57) ABSTRACT

A flash memory device comprises a non-volatile memory core operatively connected to first and second buffer memories through a page buffer. The device further comprises a first register adapted to receive command and address information from a host system, a copy circuit adapted to copy the command and address information from the first register to a second register within a control logic circuit. The device alternately transfers information to the first and second buffer memories during a cache read operation comprising a plurality of data read operations.

13 Claims, 7 Drawing Sheets

FLASH MEMORY DEVICE SUPPORTING CACHE READ OPERATION

BACKGROUND OF THE INVENTION

1. Field of the Invention

Embodiments of the present invention relate generally to a semiconductor memory device. More particularly, embodiments of the invention relate to a flash memory device and an associated cache read operation.

A claim of priority is made to Korean Patent Application No. 2005-27659, filed on Apr. 1, 2005, the disclosure of which is hereby incorporated by reference in its entirety.

2. Description of Related Art

Semiconductor memory devices can be broadly classified into two categories: volatile memory devices and non-volatile memory devices. Volatile memory devices include, for example, random access memory (RAM). A RAM typically stores information by either setting a logic state of a flip-flop, as in a static random access memory (SRAM) or by charging a capacitor as in a dynamic random access memory (DRAM). Volatile memory devices can only store data as long as they receive power. They lose stored data when their power supplies are interrupted.

In contrast, non-volatile memory devices such as masked read only memory (MROM), programmable read only memory (PROM), erasable programmable read only memory (EPROM) and electrically erasable programmable read only memory (EEPROM) continue to store data even when their power supplies are interrupted. Non-volatile memory devices may store data permanently, or they may be reprogrammable, depending upon the fabrication technology used to create the devices. For example, EEPROMs, which are programmed electrically, can be repeatedly reprogrammed. However, PROMs, which are programmed by blowing fuses, can only be programmed once.

Because non-volatile memory devices retain stored data even when power is cut off, they are commonly used to store microcode in a wide variety of applications in the computer, avionics, telecommunications, and consumer electronics industries. Some systems also use a combination of a volatile memory and a non-volatile memory to provide non-volatile storage capability in high performance applications. For example, a non-volatile SRAM (nvRAM) loads data from a non-volatile memory to a SRAM to run a program. When the program runs, the data may be updated in the SRAM. Then, to preserve the data when power is disconnected, the data is stored back in the SRAM. In addition, dozens of special memory architectures have evolved which contains some additional logic circuitry to optimize their performance for specific tasks.

Unfortunately, a user cannot freely program MROMs, PROMs, and EPROMs. For instance, erasing an EPROM requires applying an ultraviolet (UV) light to the memory's surface for an extended period of time. In contrast, EEPROMs can be electrically erased and programmed in an efficient manner. As a result, EEPROMs are commonly used to supplement conventional memory systems or to store data that requires non-volatile storage, but undergoes periodic updates.

One of the most popular forms of EEPROM currently is flash memory. Flash memories have a higher integration density than most other types of EEPROM and as a result, they are often used to provide mass storage. Flash memory is typically divided into two categories depending on the type of logic gate used in each memory cell. These categories are NAND flash memories, and NOR flash memories.

NOR flash memories generally provide faster read times than NAND flash memories, but they are more expensive, they are slower to write and erase, they can withstand less programming, and they take up more space. As a result, NOR flash memories are generally used to store program code, while NAND flash memories are used to provide mass data storage.

Where a memory system includes both NAND flash memory and NOR flash memory, control circuitry for the memory system becomes complex. One way to address this complexity is through an integrated memory architecture. In an integrated memory architecture, program code that is ordinarily stored in a NOR flash memory is stored in a OneNAND™ flash memory together with data previously stored in a NAND memory. An exemplary OneNAND™ flash memory is disclosed in the data book of Samsung Electronic Co., Ltd., published in September, 2003, which is hereby incorporated by reference. In the integrated memory architecture, data is transferred between the OneNAND™ flash memory and a host system.

SUMMARY OF THE INVENTION

According to selected embodiments of the invention, a flash memory device is provided. The flash memory device is adapted to perform a cache read operation comprising a series of consecutive data read operations. Typically, the flash memory device comprises first and second buffer memories and a non-volatile memory core. The non-volatile memory core comprises a non-volatile memory cell array comprising a plurality of memory blocks, each memory block comprising a plurality of pages, and a page buffer adapted to read data from a selected memory block. The flash memory device further comprises a first register adapted to store address and command information, a control logic circuit comprising a second register and adapted to generate an enable signal upon detecting that command information is written into the first register, and a copy circuit adapted to copy the address and command information stored in the first register to the second register in response to the enable signal. Generally, the control logic circuit controls the first and second buffer memories and the non-volatile memory core based on the address and command information stored in the second register. In addition, address information for a next data read operation is typically stored in the first register.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
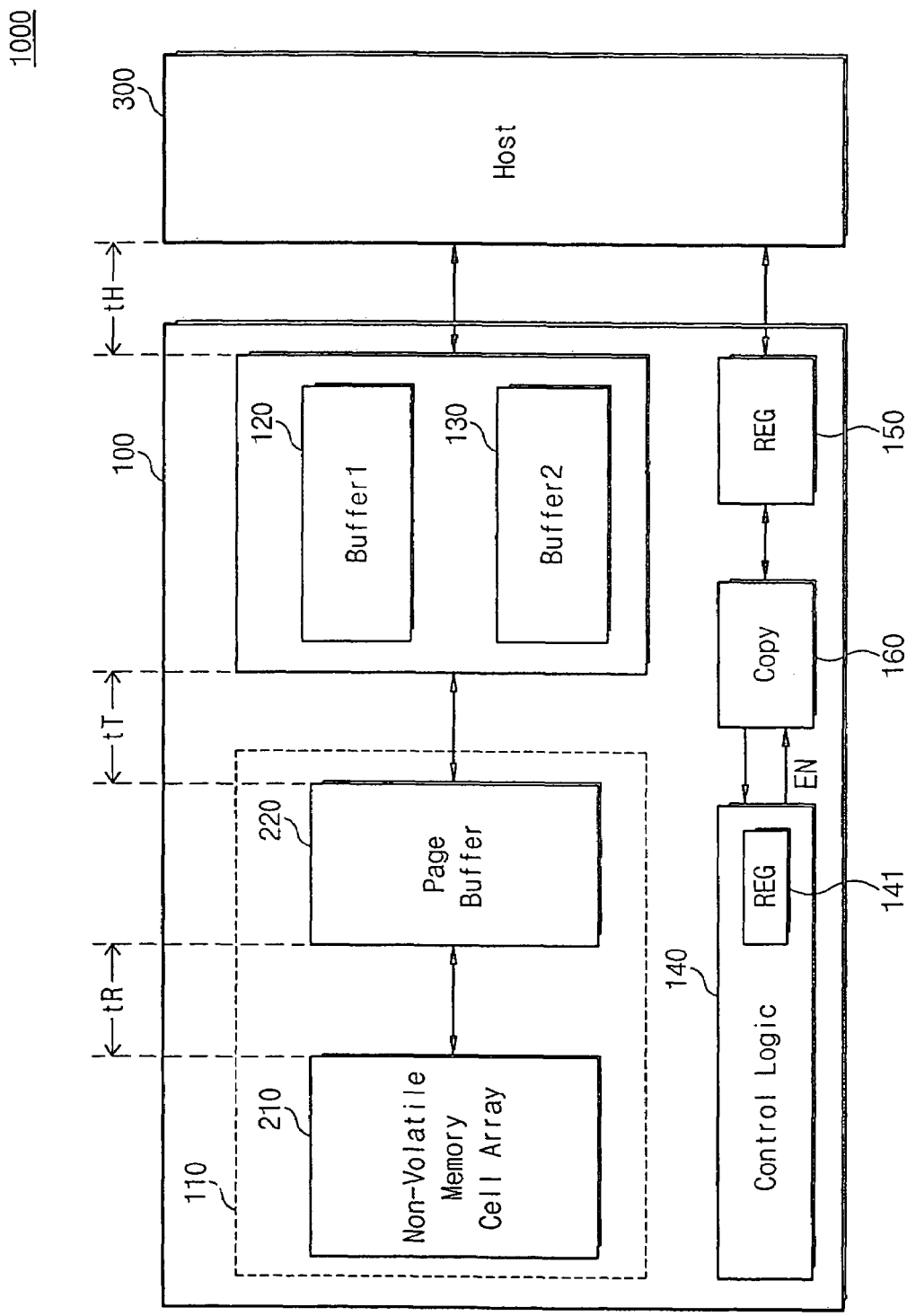
FIG. 1 is a block diagram of a memory system according one embodiment of the present invention.

FIG. 1 is a block diagram of a memory system according one embodiment of the present invention. Referring to FIG. 1, a memory system 1000 comprises a OneNAND flash memory 100 and a host 300. OneNAND flash memory 100 performs read/write operations under the control of host 300. OneNAND flash memory 100 comprises a non-volatile memory core 110, a first buffer memory 120, a second buffer memory 130, a control logic circuit 140, a register 150, and a copy circuit 160.

Non-volatile memory core 110 comprises a non-volatile memory cell array 210 and a page buffer 220 and is controlled by control logic circuit 140. First and second buffer memories 120 and 130 are controlled by control logic circuit 140 and host 300 to independently perform read/write operations. First and second buffer memories 120 and 130 are used to temporarily store data output from non-volatile memory core 110, or data to be stored in non-volatile memory core 210. Preferably, first and second buffer memories 120 and 130 comprise SRAMs. Alternatively, they could comprise DRAMs.

Control logic circuit 140 controls non-volatile memory core 110 and buffer memories 120 and 130 based on address and command information stored in a register 141 within control logic circuit 140. In particular, control logic circuit 140 uses the address and command information to control a cache read operation performed by non-volatile memory core 110 and first and second buffer memories 120 and 130. The cache read operation is performed in response to a cache read command input to OneNAND flash memory 100 by host 300. When host 300 inputs the cache read command to OneNAND flash memory 100, control logic circuit outputs an enable signal EN.

Host 300 inputs the command and address information to OneNAND flash memory 100 through register 150. The command and address information typically comprises a block address, a page address, buffer select information, and read/write/erase commands for non-volatile memory core 210. Copy circuit 160 copies data stored in register 150 to register 141 in response to enable signal EN.

Figure 2:
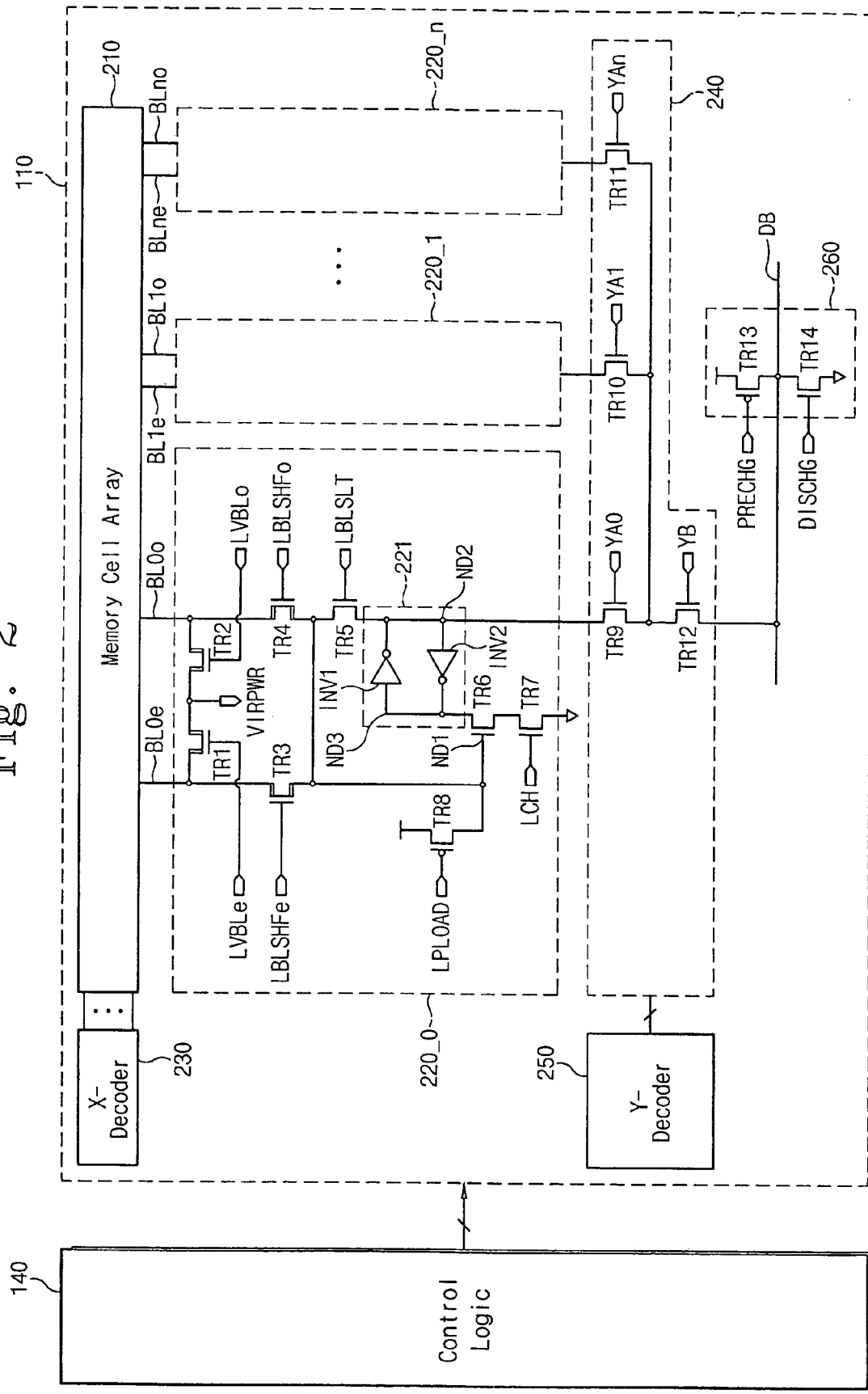
FIG. 2 is a block diagram of a non-volatile memory core shown in FIG. 1.

FIG. 2 is a block diagram of non-volatile memory core 110. Referring to FIG. 2, non-volatile memory core 110 comprises memory cell array 210, which includes a plurality of NAND strings (not shown). Each of the NAND strings comprises a string select transistor, a ground select transistor, and memory cell transistors serially coupled between the string and ground select transistors. Transistors of the respective NAND strings are controlled by a row decoder circuit 230 based on an operating mode of non-volatile memory core 110. In addition, the NAND strings are electrically connected to each other.

Non-volatile memory core 110 further comprises a plurality of bitlines arranged in bitline pairs. For example, pairs of bitlines are denoted as "BLie" and "BLio" in this figure, where "i" ranges from 0 to "n". Page buffer 220 comprises a plurality of page buffers 220_0 through 220_n, each connected to a corresponding one of the bitline pairs. The internal circuitry of page buffers 220_0 through 220_n is described with reference to page buffer 220_0. Remaining page buffers 220_1 through 220_n are similar to page buffer 220_0 and therefore further explanation of these page buffers is omitted to avoid redundancy.

Page buffer 220_0 comprises a latch 221, NMOS transistors TR1 through TR7, and a PMOS transistor TR8. Page buffer 220_0 acts as a register for storing data to be programmed to or read-out from memory cell array 210. Transistors TR1 and TR2 are used to reset bitlines BLie and BLio to ground in a bitline reset period of a read operation and to set an unselected bitline to ground in another period of the read operation. Transistors TR3 and TR4 are used to electrically connect a selected bitline to a node ND1 and to insulate the unselected bitline from node ND1. PMOS transistor TR8 is used to charge node ND1, and NMOS transistors TR6 and TR7 are used to control a logic state of a latch 221 based on a logic state of node ND1.

A column gate circuit 240 selects page buffers 220_0 through 220_n in response to corresponding select signals YA0 through YAn and YB from a column decoder 250. Column gate circuit 240 electrically connects selected page buffers to a data bus DB. In FIG. 2, column gate circuit 240 connects a single data bus DB to page buffers 220_0 through 220_n. However, more data buses could be connected to page buffers 220_0 through 220_n via column gate circuit 240. A charge and discharge circuit 260 charges data bus DB to a power supply voltage in response to a control signal PRECHG and discharges data DB to ground in response to a control signal DISCHG. Elements 210 through 260 shown in FIG. 2 are controlled by control logic circuit 140.

Those skilled in the art will understand that the configuration of non-volatile memory core 110 can be varied in a number of ways. For example, another non-volatile memory device is disclosed in U.S. Pat. No. 6,671,204, which is hereby incorporated by reference.

Figure 3:
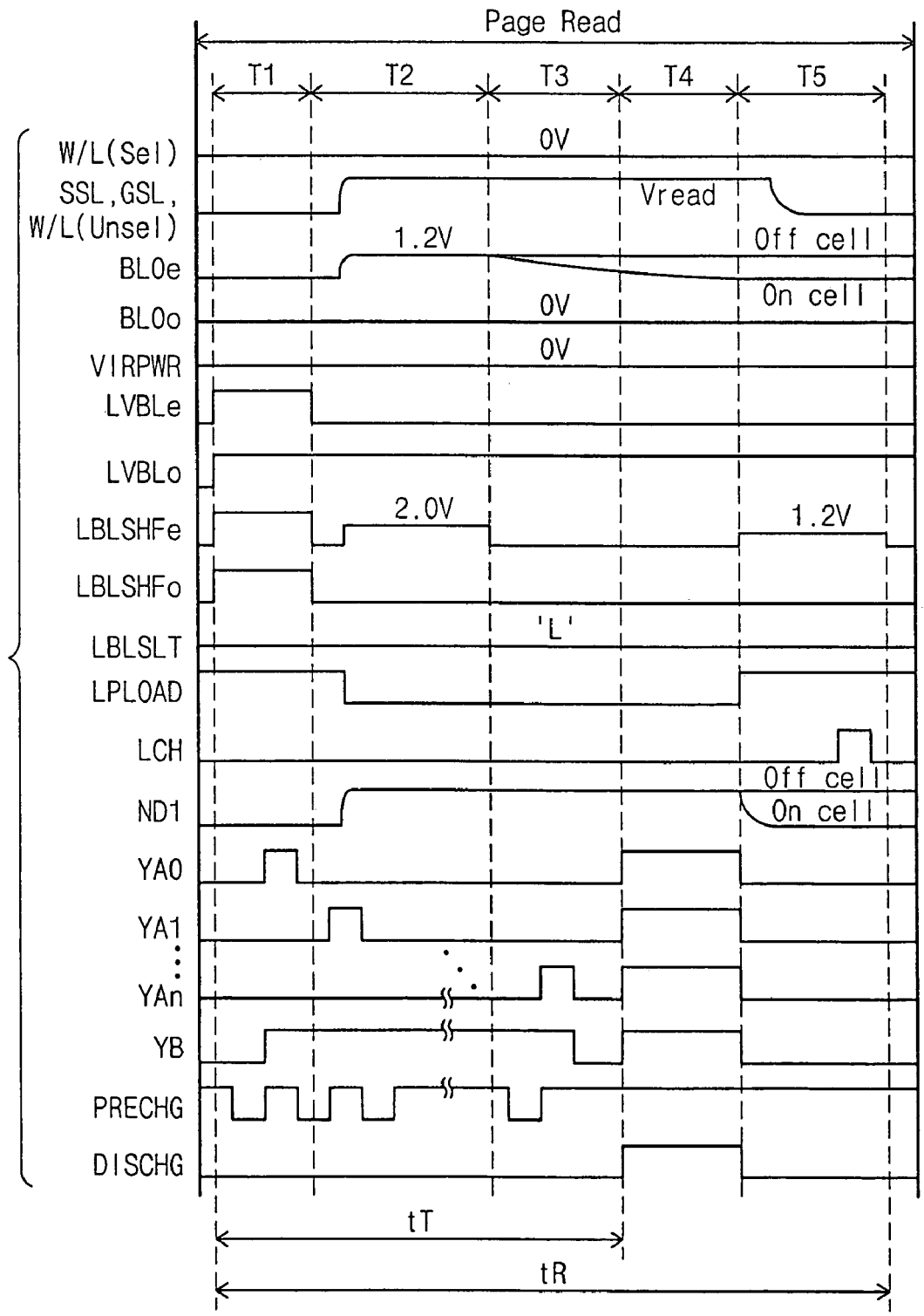
FIG. 3 is a waveform timing diagram illustrating a read operation of the non-volatile memory core shown in FIG. 2.

FIG. 3 contains a waveform timing diagram illustrating a read operation of non-volatile memory core 110 illustrated in FIG. 2. The read operation includes a bitline reset period T1, a bitline precharge period T2, a bitline develop period T3, a latch reset period T4, and a sense period T5. Page buffers 220_0 through 220_n are all controlled in the same way by control logic circuit 140. Accordingly, the operation of only one page buffer 220_0 will be described to avoid redundancy.

In the description that follows, it is assumed that a bitline BL0e connected to page buffer 220_0 is selected and a bitline BL0o connected to page buffer 220_0 is unselected. In addition, a voltage of 0V is applied to selected wordlines during periods T1 through T5 and a read voltage Vread is applied to a string select line SSL, a ground select line GSL, and unselected wordlines during periods T2 through T4.

In bitline reset period T1, control signals LVBLe, LVBLo, LBLSHFe, LBLSHFo, and LPLOAD are activated (i.e., set to a logic level "high"). Where control signals LVBLe, LVBLo, LBLSHFe, and LBLSHFo are activated, bitlines BL0e and BL0o are electrically connected to a power line VIRPWR having a ground voltage (0V). Thus, bitlines BL0e and BL0o are reset to ground. In particular, control signal LBLSLT is maintained at a logic level "low" in bitline reset period T1 to reset a latch 221.

After bitlines BL0e and BL0o are reset, bitline BL0e is precharged using a predetermined precharge voltage (e.g., 1.2V) in bitline precharge period T2. In particular, control signals LVBLe and LBLSHF0 are deactivated (i.e., set to logic level "low"), bitline BL0e is electrically insulated from power line VIRPWR, and bitline BL0o is electrically insulated from node ND1. Control signal LVBL0 is maintained at logic level "high" in bitline precharge period T2, and therefore bitline BL0o is electrically connected to power line VIRPWR, which has the ground voltage. At the same time, control signal LPLOAD is deactivated to turn on PMOS transistor TR8. As a result, transistor T8 provides current to bitline BL0e through NMOS transistor TR3. Control signal LBLSHFe assumes a voltage of 2.0V, and bitline BL0e is precharged to a voltage equal to 2.0V−Vth, where Vth is a threshold voltage of the TR3.

In bitline develop period T3, the voltage level of bitline BL0e is either maintained at the precharge voltage or it transitions to ground based on a state (i.e., a program state or an erase state) of a corresponding selected memory cell. More specifically, control signal LBLSHFe is deactivated to turn off NMOS transistor TR3, thereby electrically insulating bitline BL0e from node ND1. Accordingly, where the selected memory cell is in the erase state (ON state), the voltage level of bitline BL0e starts to be discharged to ground. On the other hand, where the selected memory cell is in the program state (or OFF state), bitline BL0e maintains the precharge voltage.

Periods T1 through T3 generally constitute a period in which data stored in the selected memory cell becomes apparent on a selected bitline. Accordingly, periods T1 through T3 are referred to collectively as a "bitline set period".

After the bitline set period is completed, latch 221 is reset in latch reset period T4. Latch 221 is reset by electrically connecting a node ND2 to data bus DB through column gate circuit 240. As illustrated in FIG. 3, select signals YA0 through YA and YB applied to column gate circuit 240 are all activated in latch reset period T4. A control signal DISCHG is activated so that data bus DB assumes the ground voltage. As a result, node ND2 is electrically connected to data bus DB through column gate circuit 240 while data bus DB is grounded through an NMOS transistor TR14 of charge and discharge circuit 260, thereby resetting latch 221.

In sense period T5, cell data apparent on bitline BL0e is stored in latch 221. To store the cell data apparent on bitline BL0e in latch 221, control signal LPLOAD is activated and control signal LBLSHFe assumes a voltage of about 1.2V to turn on transistor T3. Where the memory cell connected to bitline BL0e is in the ON state, node ND1 is discharged to ground through the memory cell. On the other hand, where the memory cell connected to bitline BL0e is in the OFF state, node ND1 maintains the power supply voltage.

Where node ND1 is discharged to ground, transistor TR6 is turned off, and where node ND1 maintains the power supply voltage, transistor T6 is turned on. A control signal LCH is activated as a pulse in sense period T5, turning on transistor TR7. Accordingly, where transistor T6 is turned on, a node ND3 of latch 221 is connected to ground through NMOS transistors TR6 and TR7. Otherwise, where transistor T6 is turned off, node ND3 is maintained at logic level "high".

During a cache read operation of OneNAND flash memory 100, data stored in latches 221 of page buffers 220_0 through 220_n is sequentially transferred to column gate circuit 240 during bitline set period T1 through T3. The data may be transferred between page buffers 220_0 through 220_n and column gate circuit 240 using a variety of different data input/output configurations. For example, data stored in latches 221 of page buffers 220_0 through 220_n can be transferred to data bus DB during bitline set period T1 through T3. This may be achieved by sequentially activating select signals YA0 through YAn while maintaining select signal YB at logic level "high", as shown in FIG. 3. Also, using the power supply voltage, data bus DB can be charged at intervals between when select signals YA0 through YAn are activated. This can be achieved by activating a PMOS transistor T13 in charge and discharge circuit 260.

As described above, data stored in page buffers 220_0 through 220_n is transferred to data bus DB during bitline set period T1 through T3. The data transferred to data bus DB is output to one of buffer memories 120 and 130. The time required to transfer data from non-volatile memory cell array 210 to page buffer 220 is denoted by a data read time "tR". The time required to transfer data between page buffer 220 and buffer memory 120 or 130 is denoted by a buffer transfer time "tT". A time required to transfer data from buffer memory 120 or 130 to host 300 is denoted by a host transfer time "tH".

Figure 4A:
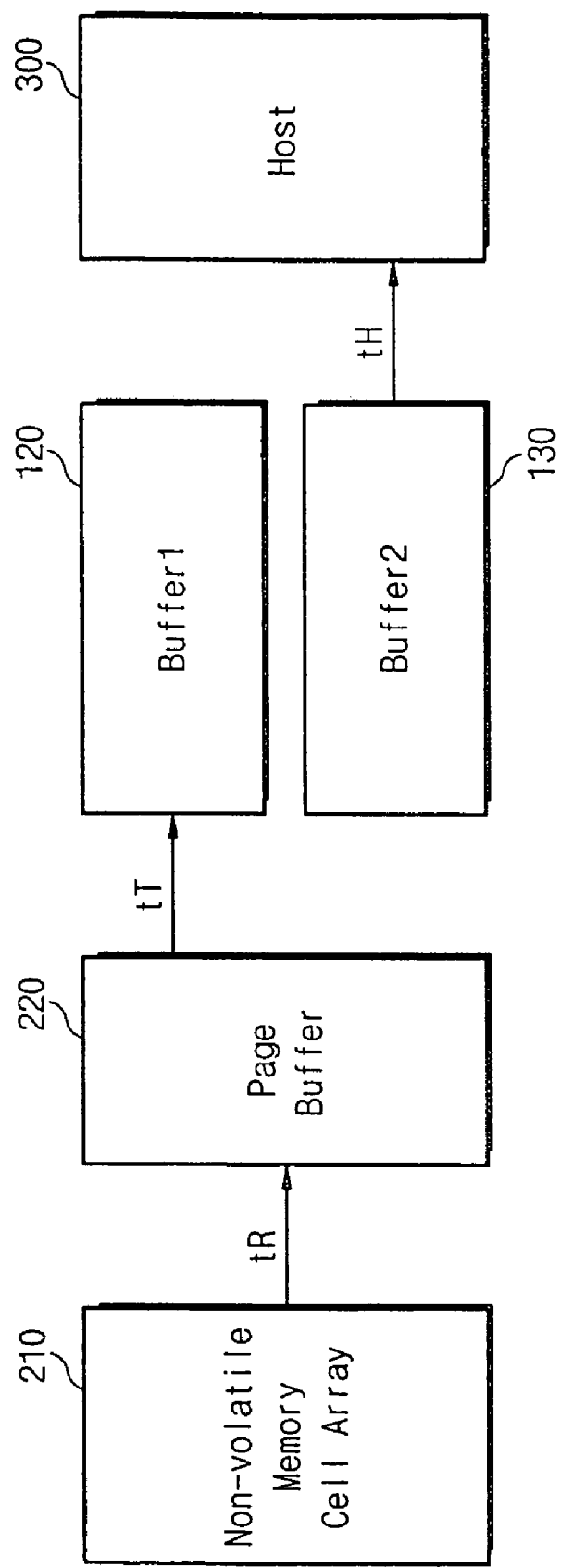
FIGS. 4A and 4B illustrate a data transfer path used in a cache read operation according to an embodiment of the present invention.
Figure 4B:
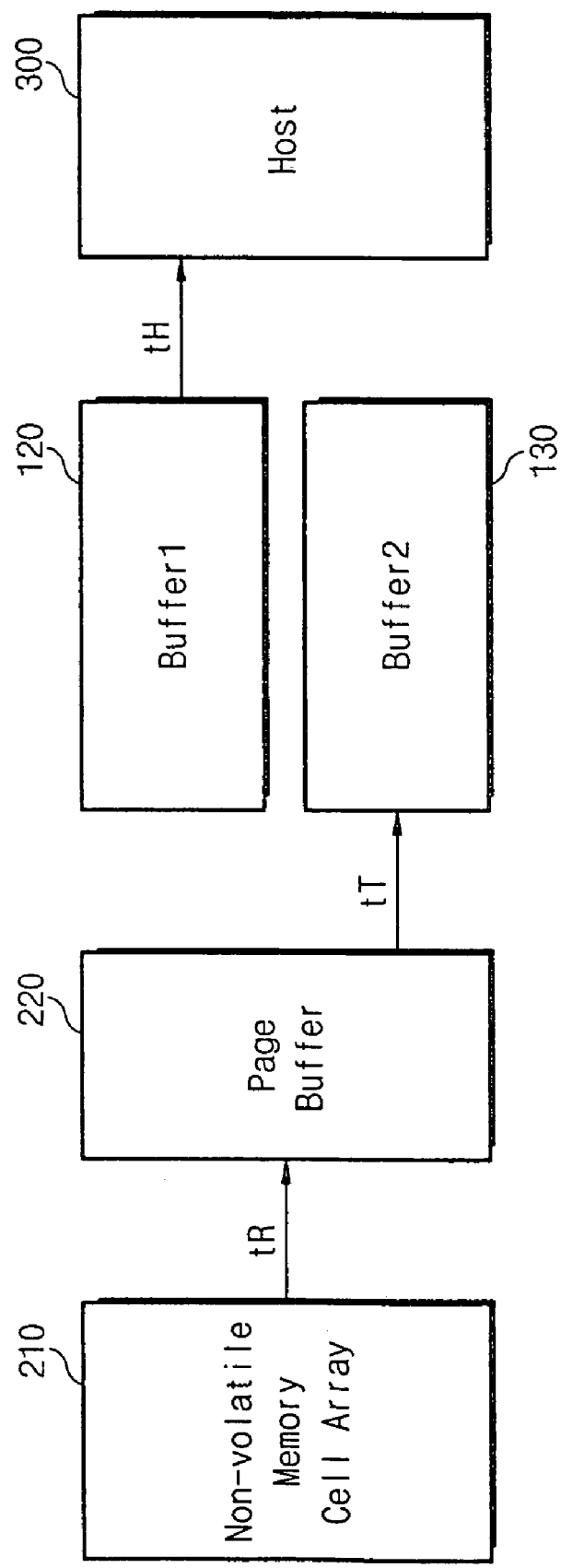

FIGS. 4A and 4B illustrate a data transfer path used for a cache read operation. Referring to FIG. 4A, data is first transferred from non-volatile memory core 110 to page buffer 220 in data read time tR. The data is then transferred from page buffer 220 to first page buffer 120 in buffer transfer time tT. Times tR and tT both occur in bitline set period T1 through T3. The data is then subsequently transferred from second buffer memory 130 to host 300 in host transfer time tH during an overall period T1 through T5 of the read operation. The transfer of data between non-volatile memory cell array 210 and host 300 occurs under the control of control logic circuit 140. The process of reading data from nonvolatile memory cell array 210 and transferring the data to host 300 is denoted by the term "cache read operation".

Similarly, referring to FIG. 4B, data is transferred from non-volatile memory core 110 to page buffer 220 in data read time tR. The data is then transferred from page buffer 220 to second page buffer 130 in buffer transfer time tT. Times tR and tT both occur in bitline set period T1 through T3. The data is then subsequently transferred from second buffer memory 130 to host 300 in host transfer time tH during an overall period T1 through T5 of the read operation. The transfer of data between non-volatile memory cell array 210 and host 300 occurs under the control of control logic circuit 140. Where consecutive read operations are performed, host transfer time tH is concealed behind data read time tR. Similarly, data read time tR may be concealed behind host transfer time tH.

Figure 5:
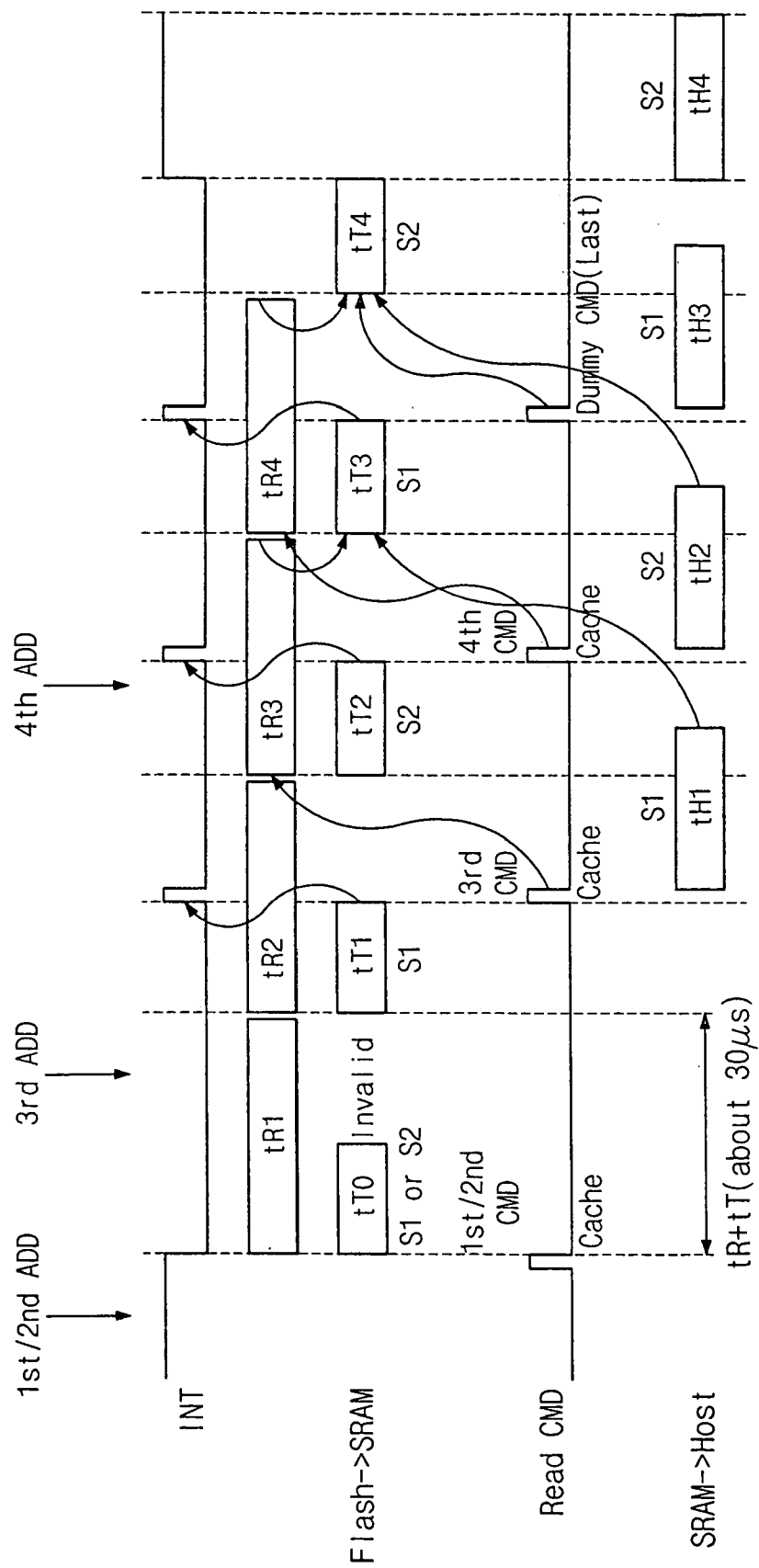
FIG. 5 is a waveform timing diagram illustrating a cache read operation of a memory system according to en embodiment of the present invention; and, FIG. 6 is a waveform timing diagram illustrating a normal read operation of a memory system according to an embodiment of the present invention.

FIG. 5 is a waveform timing diagram illustrating a cache read operation of memory system 1000 according to an embodiment of the present invention. In the cache read operation, four pages of data are transferred to host 300 from OneNAND flash memory 100. To read each page, an address and a command for each page is stored in a register 150. The address and the command stored in register 150 are transferred to register 141 of control logic circuit 140 through copy circuit 160.

Referring to FIG. 5, an interrupt signal INT is maintained at logic level "high" while page addresses for selecting first and second pages, together with block address and buffer select information, are stored in a register 150 under the control of host 300. After the address information is stored in register 150, host 300 stores a cache read command in register 150.

Once the cache read command is stored in register 150, control logic circuit 140 causes interrupt signal INT to transition from logic level "high" to logic level "low". At the same time, control logic circuit 140 activates enable signal EN in response to the cache read command. In other words, control logic circuit 140 detects the cache read command and activates enable signal EN based on the detection.

Copy circuit 160 copies the address and command information stored in register 150 to register 141 of control logic circuit 140 in response to the activation of enable signal EN. Then, control logic circuit 140 controls non-volatile memory core 110 and buffer memories 120 and 130 to perform the cache read operation based on the address and command information stored in register 141.

A memory block of memory cell array 210 is selected by row decoder 230, and the first page in the selected memory block is also selected by row decoder 230. For explanation purposes, it will be assumed that among bitline pairs BLie and BLi0o, even-numbered bitlines BLie are selected. In bitline reset period T1, all bitlines BLie and BLi0o are reset to ground. Then, in bitline precharge period T2, selected bitlines BLie are precharged to the precharge voltage. In bitline develop period T3, data stored in memory cells of the selected page becomes apparent on selected bitlines BLie.

In reset period T4, latches 221 of page buffers 220_0 through 220_n are reset to ground by electrically connecting them to data bus DB through column gate circuit 240. Next, in sense period T5, data apparent on selected bitlines BLie is transferred to corresponding latches 221. During periods T1 through T3, data stored in latches 221 is transferred to data bus DB through column gate circuit 240 and the data transferred to data bus DB is stored in second buffer memory 130 under the control of control logic circuit 140. At this time, the data stored in second buffer memory 130 is invalid.

Data stored in latches 221 is transferred to second buffer memory 130 during a buffer transfer time tT0. Once a read operation for the first page completes, i.e., a first data read time tR1 elapses, non-volatile memory core 110 is controlled to read data from a second page corresponding to a gate address stored in register 141. As illustrated in FIG. 5, data from the second page is automatically stored in register 141 under the control of control logic circuit 140 without resetting register 150. Similarly, data stored in latches 221 during a second data read time tR2, is transferred to data bus DB through column gate circuit 240. The data transferred to data bus DB is stored in first buffer memory 120 (denoted S1 in FIG. 5) under the control of control logic circuit 140.

While the first and second pages are stored in respective second and first page buffers 130 and 120, host 300 stores a third page address in register 150. The third page address is typically stored in register 150 in a period where interrupt signal INT is deactivated.

Once the data is loaded into first buffer memory 120 after time tT1, control logic circuit 140 activates interrupt signal INT When interrupt signal INT is activated, host 300 inputs a third cache read command to register 150. At the same time, the data stored in first buffer memory 120 is transferred to host 300 during a first host transfer time tH1. As illustrated in FIG. 5, host 300 outputs a first cache read command to OneNAND flash memory 100 and receives data after a time of about 30 microseconds.

Once host 300 stores the third cache read command in register 150, control logic circuit 140 activates enable signal EN. Copy circuit 160 copies an address and command information (i.e., a third page address and a cache read command) stored in register 150 to register 141 in response to the activation of enable signal EN. The read operation based on the third cache read command is identical to the read operations based on the first and second cache read commands and therefore it will not be described in further detail.

As illustrated in FIG. 5, host 300 stores a fourth page address in register 150 while a data read operation is performed. During the third data read time tR3, data read from non-volatile memory core 110 during second data read time tR2 is transferred to second buffer memory 130 (denoted as S2 in FIG. 5) in a second buffer transfer time tT2. After the data is transferred to second buffer memory 130 in second buffer transfer time tT2, control logic circuit 140 activates interrupt signal INT Once interrupt signal INT is activated, host 300 stores a fourth cache read command in register 150. In addition, host 300 receives data stored in second buffer memory 130 during a second host transfer time tH2.

After host 300 stores the fourth cache read command in register 150, control logic circuit 140 activates enable signal EN. Copy circuit 160 then copies address and command information stored in register 150 (i.e., fourth page address and cache read command) to register 141 in response to the activation of enable signal EN. The read operation based on the fourth cache read command is identical to the read operations based on the first, second, and third cache read commands and therefore it will not be described in further detail.

Finally, host 300 stores a dummy cache read command in register 150 to transfer data read out in the fourth read operation to a buffer memory. When the dummy cache read command is stored in the register 150, control logic circuit 140 activates enable signal EN. Copy circuit 160 copies the dummy cache read command from register 150 to register 141 in response to the activation of enable signal EN. Whenever the dummy cache read command is stored in register 141, control logic circuit 140 controls non-volatile memory core 110 to transfer data stored in latches 221_0 through 2201_n (i.e., data read out in the fourth read operation) to second buffer memory 130 without performing a read operation. After the data is transferred to second buffer memory 130 (i.e., after time tT4), control logic circuit 140 activates interrupt signal INT. The data stored in second buffer memory 130 is then transferred to host 300 during a host transfer time tH4.

Although the dummy cache read command is used to read a last page of data, a non-dummy cache read command can also be used.

As described above, a page address to be selected next is stored in register 150 during a period where interrupt signal INT is maintained at logic level "low". Accordingly, a page address to be selected next is stored in register 150 together with a block address and buffer select information, between successive host transfer times tH. Where a host transfer operation is inconsecutively performed, a page address to be selected next may be stored in register 150 during an interrupted host transfer period.

Figure 6:
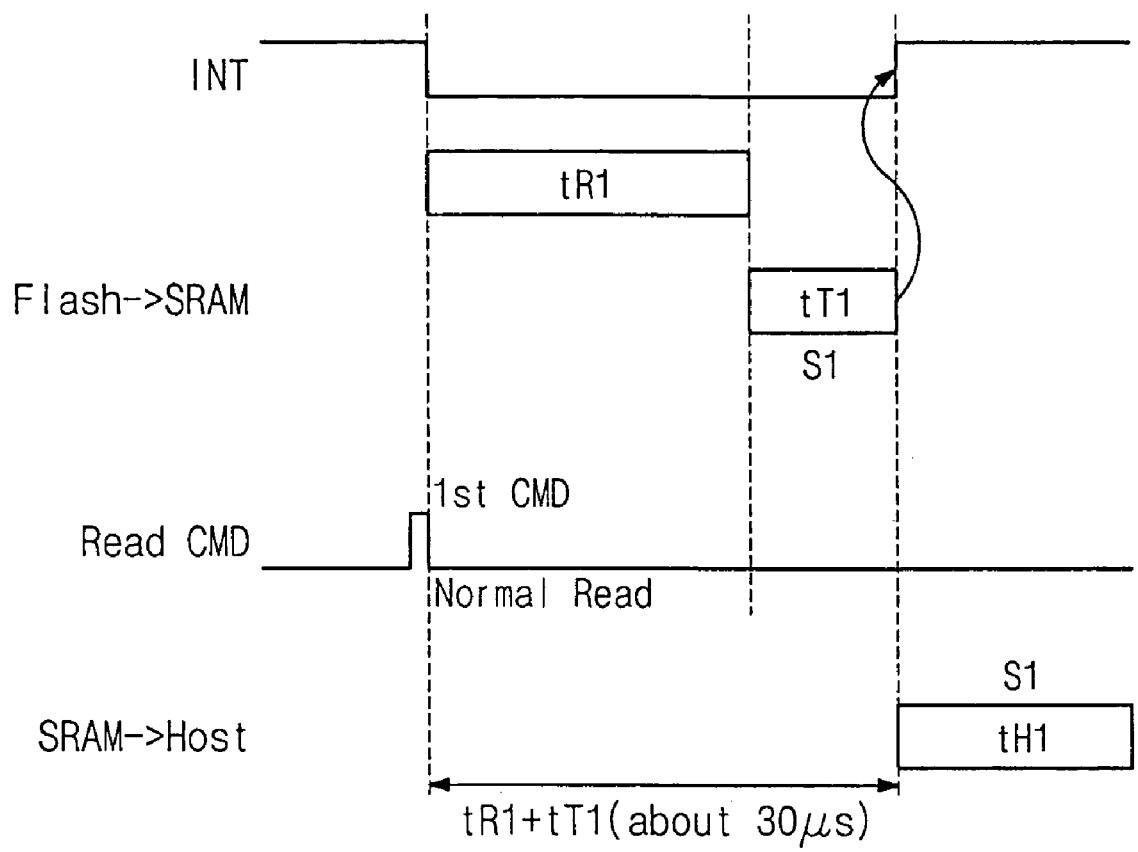

FIG. 6 is a timing diagram illustrating a read operation of memory system 1000 according to still another embodiment of the present invention. The read operation illustrated in FIG. 6 is used to read data from a single page. As illustrated in FIG. 6, while interrupt signal INT is activated, a page address for selecting any page is stored in register 150 of a OneNAND flash memory 100 under the control of host 300.

Once address information is stored in register 150, host 300 stores a read command in register 150. Once the read command is stored in register 150, control logic circuit 140 deactivates interrupt signal INT. At the same time, control logic circuit 140 activates enable signal EN in response to an input of a read command. Copy circuit 160 copies address and command information stored in register 150 to register 141 in response to the activation of enable signal EN. According to the address and command information stored in register 141, a read operation of a non-volatile memory core 110 is performed under the control of control logic circuit 140 during first data read time tR1.

Data read from non-volatile memory core 110 is transferred to a buffer memory (e.g., first buffer memory 120) under the control of control logic circuit 140 during first buffer transfer time tT1. Once the data is transferred to the buffer memory, control logic circuit 140 activates interrupt signal INT Host 300 receives the data stored in the buffer memory in response to the activation of interrupt signal INT. As illustrated in FIG. 6, host 300 outputs a read command to OneNAND flash memory 100 and receives data from OneNAND flash memory 100 after a time of about 30 microseconds.

As illustrated in FIG. 5 and FIG. 6, the time required for host 300 to output a read command/cache read command is nearly equal to time required for host 300 to receive first data. In other words, a cache read operation and a normal read operation are controlled by control logic circuit 140 using the same read scheme.

The foregoing preferred embodiments are teaching examples. Those of ordinary skill in the art will understand that various changes in form and details may be made to the exemplary embodiments without departing from the scope of the present invention as defined by the following claims.

What is claimed:

1. A flash memory device supporting a cache read operation comprising a series of consecutive data read operations, the flash memory device comprising:
   first and second buffer memories;
   a non-volatile memory core comprising:
   a non-volatile memory cell array comprising a plurality of memory blocks, each memory block comprising a plurality of pages; and
   a page buffer adapted to read data from a selected memory block;
   a first register adapted to store address and command information;
   a control logic circuit comprising a second register and adapted to generate an enable signal upon detecting that command information is written into the first register; and
   a copy circuit adapted to copy the address and command information stored in the first register to the second register in response to the enable signal;
   wherein the control logic circuit controls the first and second buffer memories and the non-volatile memory core based on the address and command information stored in the second register; and
   address information for a next data read operation is stored in the first register.

2. The flash memory device of claim 1, wherein the control logic circuit activates an interrupt signal after data is transferred from the non-volatile memory core to the first or second buffer memory.

3. The flash memory device of claim 2, wherein a cache read command for the next data read operation is stored in the first register upon activation of the interrupt signal.

4. The flash memory device of claim 3, wherein the copy circuit copies the cache read command stored in the first register and address information for the next data read operation to the second register.

5. The flash memory device of claim 1, wherein the control logic circuit controls the non-volatile memory core and the first and second buffer memories based on the address and command information stored in the second register to alternately transfer data from the page buffer to the first and second buffer memories in the consecutive data read operations.

6. The flash memory device of claim 1, wherein address information for first and second data read operations is stored in the first register before starting the first data read operation.

7. The flash memory device of claim 6, wherein the copy circuit copies the address information stored in the first register to the second register together with a first cache read command after the first cache read command is input to the first register.

8. The flash memory device of claim 7, wherein the control logic circuit controls the non-volatile memory core to perform consecutive first and second data read operations after the first cache read command is transferred to the second register.

9. The flash memory device of claim 1, wherein the page buffer transfers data to the first or second buffer memory during a bitline set period of the consecutive data read operations.

10. The flash memory device of claim 1, further comprising:
    a OneNAND flash memory device incorporating the first and second buffer memories and the non-volatile memory core.

11. The flash memory device of claim 1, wherein the page buffer further comprises:
    a plurality of page buffers each connected to a corresponding memory cell in the non-volatile memory core via a bitline pair.

12. The flash memory device of claim 11, wherein each of the plurality of page buffers comprises:
    a latch adapted to store a logic state of the corresponding memory cell.

13. The flash memory device of claim 12, wherein the non-volatile memory core further comprises:
    a column gate circuit adapted to connect the plurality of page buffers to a data bus in response to a plurality of selection signals output by a column decoder.

* * * * *